(12) United States Patent
Wakui et al.

(10) Patent No.: US 10,323,184 B2
(45) Date of Patent: Jun. 18, 2019

(54) METHOD OF PRODUCING NITRIDE FLUORESCENT MATERIAL, NITRIDE FLUORESCENT MATERIAL, AND LIGHT-EMITTING DEVICE USING THE SAME

(71) Applicant: NICHIA CORPORATION, Anan-shi, Tokushima (JP)

(72) Inventors: Sadakazu Wakui, Tokushima (JP); Shoji Hosokawa, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 271 days.

(21) Appl. No.: 15/347,038

(22) Filed: Nov. 9, 2016

(65) Prior Publication Data

US 2017/0130126 A1 May 11, 2017
US 2018/0072948 A9 Mar. 15, 2018

(30) Foreign Application Priority Data

Nov. 11, 2015 (JP) .................................. 2015-221127
Nov. 8, 2016 (JP) .................................. 2016-217905

(51) Int. Cl.
| | |
|---|---|
| *C09K 11/08* | (2006.01) |
| *C09K 11/77* | (2006.01) |
| *H01L 33/32* | (2010.01) |
| *H01L 33/48* | (2010.01) |
| *H01L 33/50* | (2010.01) |
| *H01L 33/56* | (2010.01) |
| *H01L 33/62* | (2010.01) |

(52) U.S. Cl.
CPC ...... *C09K 11/7734* (2013.01); *C09K 11/0883* (2013.01); *H01L 33/32* (2013.01); *H01L 33/486* (2013.01); *H01L 33/504* (2013.01); *H01L 33/56* (2013.01); *H01L 33/62* (2013.01); *H01L 2224/32245* (2013.01); *H01L 2224/48091* (2013.01); *H01L 2224/48247* (2013.01); *H01L 2224/48257* (2013.01); *H01L 2224/73265* (2013.01); *H01L 2924/181* (2013.01); *H01L 2933/0041* (2013.01)

(58) Field of Classification Search
CPC . H01L 33/502; H01L 33/504; C09K 11/7734; C09K 11/7749; C09K 11/0883; C09K 11/57
See application file for complete search history.

(56) References Cited

U.S. PATENT DOCUMENTS

| | | |
|---|---|---|
| 2010/0164367 A1 | 7/2010 | Shioi et al. |
| 2015/0123155 A1 | 5/2015 | Schmidt et al. |
| 2016/0040063 A1 | 2/2016 | Shimooka et al. |

FOREIGN PATENT DOCUMENTS

| | | | |
|---|---|---|---|
| CN | 105400513 | * | 3/2016 |
| JP | 2009132916 A | | 6/2009 |
| JP | 2014145047 A | | 8/2014 |
| JP | 2015526532 A | | 9/2015 |
| WO | WO 2013/175336 | * | 11/2013 |
| WO | 2014123198 A1 | | 8/2014 |

OTHER PUBLICATIONS

European Patent Office, Extended European Search Report in EP 16198492, dated Jun. 7, 2017.
Philipp Pust et al., "Narrow-band red-emitting Sr[LiA13N4]: Eu2+ as a next-generation LED-phosphor material", Nature Materials, vol. 13, No. 9. (Jun. 22, 2014), pp. 891-896.
Philipp Pust et al. "Narrow-band red-emitting Sr[LiAl3N4]:Eu2+ as a next-generation LED-phosphor material" Nature Materials, NMAT4012, vol. 13 Sep. 2014. http://www.nature.com/nmat/journal/v13/n9/abs/nmat4012.html.

* cited by examiner

*Primary Examiner* — C Melissa Koslow
(74) *Attorney, Agent, or Firm* — Hunton Andrews Kurth LLP

(57) ABSTRACT

A method of producing a nitride fluorescent material having a high light emission intensity and including a calcined product having a composition represented by formula $M^a_v M^b_w M^c_x M^d_y N_z$ is provided. $M^a$ is at least one element selected from Sr, Ca, Ba, and Mg; $M^b$ is at least one element selected from Li, Na, and K; $M^c$ is at least one element selected from Eu, Mn, Tb, and Ce; $M^d$ is at least one element selected from Al, B, Ga, and In; v, w, x, y, and z satisfy $0.8 \leq v \leq 1.1$, $0.8 \leq w \leq 1.1$, $0.001 < x \leq 0.1$, $2.0 \leq y \leq 4.0$, and $3.0 \leq z \leq 5.0$, respectively. The nitride fluorescent material includes elemental oxygen in a range of 2% or more and 4% or less by mass. The method includes mixing the calcined product with a polar solvent having a relative dielectric constant in a range of 10 or more and 70 or less at 20° C.

16 Claims, 6 Drawing Sheets

METHOD OF PRODUCING NITRIDE FLUORESCENT MATERIAL, NITRIDE FLUORESCENT MATERIAL, AND LIGHT-EMITTING DEVICE USING THE SAME

CROSS-REFERENCE TO RELATED APPLICATIONS

This application claims benefit of Japanese Patent Application No. 2015-221127, filed on Nov. 11, 2015 and Japanese Patent Application No. 2016-217905, filed on Nov. 8, 2016, the entire disclosures of which are incorporated herein by reference.

BACKGROUND

Technical Field

The present disclosure relates to a method of producing a nitride fluorescent material, the nitride fluorescent material, and a light-emitting device using the same.

Description of Related Art

Light-emitting devices including combinations of a light emitting diode (hereinafter may be referred to as "LED") and a fluorescent material have been increasingly applied as lighting apparatuses and backlights for liquid crystal displays, etc. For example, in the case where such light emitting devices are used in a liquid crystal display, a fluorescent material of a narrow half bandwidth is desired to provide a wider range of color reproducibility.

Examples of such a phosphor include a red light-emitting phosphor of $SrLiAl_3N_4$:Eu (hereinafter may be referred to as "SLAN phosphor"). For example, Patent Literature (PTL) 1 and Non-Patent Literature (NPL) 1 (Philipp Pust et al. "Narrow-band red-emitting $Sr[LiA1_3N_4]:Eu^{2+}$ as a next-generation LED-phosphor material" Nature Materials, NMAT4012, VOL 13 September 2014) disclose SLAN phosphors having a narrow half bandwidth of 70 nm or less and having a peak fluorescence wavelength near 650 nm.

As disclosed in NPL1, a SLAN phosphor is, for example, produced such that powder of raw materials including lithium aluminum hydride ($LiAlH_4$), aluminum nitride (AlN), strontium hydride ($SrH_2$), and europium fluoride ($EuF_3$) are weighed in a stoichiometric ratio so that Eu is 0.4 mol % and mixed. The mixture is placed in a crucible and calcined in a mixed gas atmosphere of hydrogen and nitrogen under atmospheric pressure at a temperature of 1000° C. for two hours.

CITATION LIST

Patent Literature

PTL 1: Japanese Laid-open Patent Publication No. 2015-526532

Non Patent Literature

NPL1: Philipp Pust et al. "Narrow-band red-emitting $Sr[LiAl_3N_4]:Eu^{2+}$ as a next-generation LED-phosphor material" Nature Materials, NMAT4012, VOL 13 September 2014

SUMMARY

The SLAN phosphors disclosed in PTL 1 and NPL1 still have room for further improvement in the light emission intensity. An object of the present disclosure is to provide a method of producing a nitride fluorescent material having a high light emission intensity, a nitride fluorescent material, and a light-emitting device using the same.

Specific examples for achieving the objects will be described below. Certain embodiments of the present invention include configurations illustrated below.

In a first embodiment, a method of producing a nitride fluorescent material is provided. The nitride fluorescent material includes a calcined product having a composition represented by a formula (I):

$$M^a{}_v M^b{}_w M^c{}_x M^d{}_y N_z \qquad (I)$$

in which, $M^a$ is at least one element selected from the group consisting of Sr, Ca, Ba, and Mg; $M^b$ is at least one element selected from the group consisting of Li, Na, and K; $M^c$ is at least one element selected from the group consisting of Eu, Mn, Tb, and Ce; $M^d$ is at least one element selected from the group consisting of Al, B, Ga, and In; and v, w, x, y, and z are numbers satisfying $0.8 \le v \le 1.1$, $0.8 \le w \le 1.1$, $0.001 < x \le 0.1$, $2.0 \le y \le 4.0$, and $3.0 \le z \le 5.0$, respectively, and includes elemental oxygen at a content range of 2% by mass or more and 4% by mass or less. The method includes preparing the calcined product having the composition represented by formula (I), and mixing the calcined product with a polar solvent having a relative dielectric constant in a range of 10 or more and 70 or less at 20° C.

In a second embodiment, a method of producing a nitride fluorescent material including elemental oxygen in a range of 2% by mass or more and 4% by mass or less is provided. The method includes preparing a calcined product having a composition represented by a formula (I), and mixing the calcined product with a polar solvent, in which the polar solvent is alcohol and/or ketone and contains water in a range of 0.01% by mass or more and 12% by mass or less, wherein:

$$M^a{}_v M^b{}_w M^c{}_x M^d{}_y N_z \qquad (I)$$

in which $M^a$ is at least one element selected from the group consisting of Sr, Ca, Ba, and Mg; $M^b$ is at least one element selected from the group consisting of Li, Na, and K; $M^c$ is at least one element selected from the group consisting of Eu, Mn, Tb, and Ce; $M^d$ is at least one element selected from the group consisting of Al, B, Ga, and In; and v, w, x, y, and z are numbers satisfying $0.8 \le v \le 1.1$, $0.8 \le w \le 1.1$, $0.001 < x \le 0.1$, $2.0 \le y \le 4.0$, and $3.0 \le z \le 5.0$, respectively.

In a third embodiment, a nitride fluorescent material includes a calcined product having a composition represented by a formula (I):

$$M^a{}_v M^b{}_w M^c{}_x M^d{}_y N_z \qquad (I)$$

in which $M^a$ is at least one element selected from the group consisting of Sr, Ca, Ba, and Mg; $M^b$ is at least one element selected from the group consisting of Li, Na, and K; $M^c$ is at least one element selected from the group consisting of Eu, Mn, Tb, and Ce; $M^d$ is at least one element selected from the group consisting of Al, B, Ga, and In; and v, w, x, y, and z are numbers satisfying $0.8 \le v \le 1.1$, $0.8 \le w \le 1.1$, $0.001 < x \le 0.1$, $2.0 \le y \le 4.0$, and $3.0 \le z \le 5.0$, respectively, and includes elemental oxygen at a content range of 2% by mass or more 4% by mass or less.

In a fourth embodiment, a light-emitting device including a nitride fluorescent material and an excitation light source is provided.

One embodiment according to the present invention can provide a method of producing a nitride fluorescent material having a high light emission intensity, the nitride fluorescent material, and a light-emitting device using the same.

DETAILED DESCRIPTION

Figure 1:
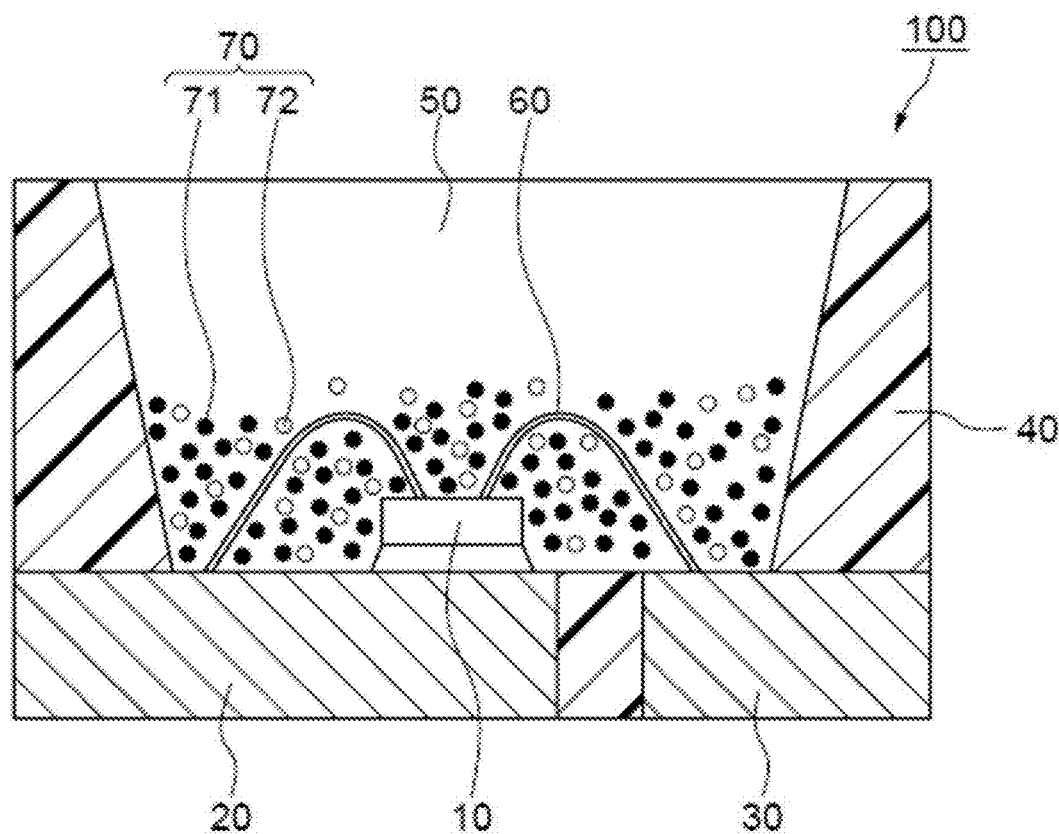
FIG. 1 is a schematic cross-sectional view showing an exemplary light-emitting device.

A method of producing a nitride fluorescent material, the nitride fluorescent material, and a light-emitting device using the same, according to the present disclosure will be described in conjunction with illustrated embodiments. The embodiments described below are intended as illustrative of a method of producing a nitride fluorescent material, the nitride fluorescent material, and a light-emitting device using the same, to give a concrete form to technical ideas of the present invention, and the scope of the invention is not limited to those described below. In the specification, the relation between the color names and the chromaticity coordinates, the relation between the ranges of wavelength of light and the color names of single color light, and the like conform to JIS Z8110. Further, the content of each component in the composition is represented by a total amount in the composition, when a plural number of substances each containing corresponding component are present in the composition, unless specifically indicated.

Method of Producing Nitride Fluorescent Material

The method of producing a nitride fluorescent material according to one embodiment of the present invention is a method of producing a nitride fluorescent material that includes a calcined product having a composition represented by a formula (I):

$$M^a{}_v M^b{}_w M^c{}_x M^d{}_y N_z \quad \quad (I)$$

in which $M^a$ is at least one element selected from the group consisting of Sr, Ca, Ba, and Mg; $M^b$ is at least one element selected from the group consisting of Li, Na, and K; $M^c$ is at least one element selected from the group consisting of Eu, Mn, Tb, and Ce; $M^d$ is at least one element selected from the group consisting of Al, Si, B, Ga, In, Ge, and Sn, particularly preferably at least one element selected from the group consisting of Al, B, Ga, and In; and v, w, x, y, and z are numbers satisfying $0.8 \le v \le 1.1$, $0.8 \le w \le 1.1$, $0.001 < x \le 0.1$, $2.0 \le y \le 4.0$, and $3.0 \le z \le 5.0$, respectively, and includes elemental oxygen at a content range of 2% by mass or more and 4% by mass or less. The method includes providing the calcined product having the composition represented by the formula (I) and mixing the calcined product with a polar solvent having a relative dielectric constant in a range of 10 or more and 70 or less at 20° C.

The method of producing a nitride fluorescent material according to another embodiment of the present invention, a method of producing a nitride fluorescent material is provided. The method includes preparing a calcined product that includes a composition represented by the formula (I), and mixing the calcined product with a polar solvent, in which the polar solvent is alcohol and/or ketone that includes water in a range of 0.01% by mass or more and 12% by mass or less.

In the method of producing a nitride fluorescent material of the present embodiment, it is preferable that in the composition represented by the formula (I), $M^a$ includes at least one of Sr and Ca, $M^b$ includes Li, $M^c$ is Eu, and $M^d$ is Al.

The method of the present embodiment includes mixing in which particles of calcined product obtained by a heat treatment are mixed with a polar solvent.

The fluorescent material obtained according to the method of the present embodiment includes a hydroxide and/or an oxide formed at least on a portion of the surface or a portion near the surface of the particles of the calcined product. It is assumed that the hydroxide and/or the oxide is originating from water contained in the polar solvent while dispersing the particles of the calcined product when mixing the calcined product having the composition shown in the formula (I) and the polar solvent. It is also assumed that with those hydroxides and/or oxides, for example, the refractive index of the fluorescent material particles is adjusted, which facilitates extraction of light from the fluorescent particles, and thus, the emission intensity of the fluorescent material can be enhanced.

Providing Calcined Product

To obtain a calcined product, the production methods of the present embodiment each comprise mixing raw materials to prepare a raw material mixture and heat treating the raw material mixture to prepare the calcined product having a composition represented by the formula (I).

Raw Material Mixture

The raw material mixture used in the production methods of the present embodiment can contain any materials as long as the calcined product having a composition represented by the formula (I) can be obtained. For example, the raw material mixture can contain at least one raw material selected from the group consisting of single elemental metals contained in the composition represented by the formula (I) and metal compounds thereof. Examples of such metal compounds include hydrides, nitrides, fluorides, oxides, carbonates, and chlorides thereof. A preferred raw material is at least one selected from the group consisting of hydrides, nitrides, and fluorides of the metal compounds in view of the enhancement of the light emitting properties of the resulting fluorescent material. When a raw material mixture contains metal compounds of an oxide, a carbonate, a chloride, and the like, a total content thereof is preferably 5% by mass or less, more preferably 1% by mass or less in the raw material mixture. Of those metal compounds, a fluoride or chloride can also be added to the raw material mixture as a source of cations of element to obtain a target ratio of cations in the resulting compound. This fluoride or chloride of the metal compound can also serve as a flux component described below.

The raw material mixture preferably contains a metal compound containing a metal element selected from the group consisting of Sr, Ca, Ba, and Mg as $M^a$; a metal compound containing a metal element selected from the group consisting of Li, Na, and K as $M^b$; a metal compound containing a metal element selected from the group consisting of Eu, Mn, Tb, and Ce as $M^c$; and a metal compound containing a metal element selected from the group consisting of Al, Si, B, Ga, In, Ge, and Sn as $M^d$.

Specific examples of the metal compound containing a metal element ($M^a$ element) selected from the group consisting of Sr, Ca, Ba, and Mg (hereinafter may also be referred to as "first metal compound") include $SrN_2$, SrN, $Sr_3N_2$, $SrH_2$, $SrF_2$, $Ca_3N_2$, $CaH_2$, $CaF_2$, $Ba_3N_2$, $BaH_2$, $BaF_2$, $Mg_3N_2$, $MgH_2$, and $MgF_2$, and at least one of those is preferably employed.

The first metal compound preferably contains at least one of Sr and Ca. When the first metal compound contains Sr, a portion of the Sr may be substituted with one or more of Ca, Mg, Ba, etc. When the first metal compound contains Ca, a portion of the Ca may be substituted with one or more of Sr, Mg, Ba, etc. Such arrangement allows for adjusting the peak fluorescence wavelength of the nitride fluorescent material.

For the first metal compound, simple metal compounds as described above can be used, or compounds such as imide compounds and amide compounds can also be used. These first metal compounds can be used alone or in combination of two or more.

The metal compound containing a metal element ($M^b$ element) selected from the group consisting of Li, Na, and K (hereinafter may also be referred to as "second metal compound") preferably contains at least Li, more preferably at least one of a nitride and a hydride of Li. When the second metal compound contains Li, a portion of the Li may be substituted with Na, K, or the like, and may contain another metal element forming the nitride fluorescent material. For the second metal compound containing Li, at least one selected from the group consisting of $Li_3N$, $LiN_3$, LiH, and $LiAlH_4$ is preferably used.

The metal compound containing a metal element ($M^d$ element) selected from the group consisting of Al, Si, B, Ga, In, Ge, and Sn (hereinafter may also be referred to as "third metal compound") may be a metal compound substantially containing only a metal element selected from the group consisting of Al, Si, B, Ga, In, Ge, and Sn as a metal element, or may be a metal compound containing a metal element partially substituted with another metal element. The third metal compound is preferably a metal compound containing only Al. The third metal compound may be a metal compound containing Al partially substituted with a metal element selected from the group consisting of Group 13 elements Ga and In and Period 4 elements V, Cr and Co, or may be a metal compound containing Al and another metal element forming the nitride fluorescent material, such as Li. Specific examples of the third metal compound containing Al can include AlN, $AlH_3$, $AlF_3$, and $LiAlH_4$, and at least one of those is preferably employed. These third metal compounds can be used alone or in combination of two or more.

The metal compound containing a metal element ($M^c$ element) selected from the group consisting of Eu, Mn, Tb, and Ce (hereinafter, also referred to as "fourth metal compound") may be a metal compound substantially containing only a metal element selected from the group consisting of Eu, Mn, Tb, and Ce as a metal element or may be a metal compound containing a metal element partially substituted with another metal element. The fourth metal compound is preferably a metal compound containing Eu, which is contained as an activator. A portion of Eu may be substituted with one or more of Sc, Y, La, Ce, Pr, Nd, Sm, Gd, Tb, Dy, Ho, Er, Tm, Yb, Lu, etc. The one or more elements substituting for a portion of Eu are thought to act, for example, as co-activator. With the use of the co-activator, the light emitting properties of the nitride fluorescent material can be adjusted. In use of a mixture containing Eu as an essential component for the nitride fluorescent material, the mixing ratio can be changed as desired. Europium mainly has divalent and trivalent energy levels. In the nitride fluorescent material of the present embodiment, at least $Eu^{2+}$ is used as an activator.

Specific examples of the fourth metal compound containing Eu include $Eu_2O_3$, EuN, and $EuF_3$, and at least one of those is preferably employed. The nitride fluorescent material according to the present embodiment contains a divalent Eu as an emission center, but the divalent Eu is easily oxidized, so that a metal compound that contains trivalent Eu can be included in the raw material mixture.

In addition to the single elemental metals and the metal compound as described above, the raw material mixture may also contain other metal elements as required. Such other metal elements can be contained in the raw material mixture, generally as an oxide, a hydroxide, or the like, but such other metal elements may be incorporated in a nitride, an imide, an amide, other inorganic salts, etc., and may be preliminarily contained in the raw material mixture.

The raw material mixture may contain a flux. Inclusion of the flux in the raw material mixture can further accelerate the reaction among the raw materials, and more uniform progress of the solid phase reaction can be achieved, so that, a fluorescent material having a large particle size and high light emitting properties can be obtained. This is assumed, for example, that in a production method where the heat treatment is performed at a temperature range of 1000° C. or more and 1300° C. or less, and a halide or the like is employed as the flux, the temperature is almost equal to the liquid phase transition temperature of the halide. Examples of the halides employed for the flux include chlorides and fluorides of rare earth metals, alkaline earth metals, and alkali metals. The flux of a compound can be added to the raw material mixture as a source of cations of element to obtain a target ratio of cations in the resulting compound, and a fluoride is particularly preferable.

When the raw material mixture contains a flux, the flux component may accelerate the reaction, but an excessive amount of the flux component may reduce the workability in the steps of producing a nitride fluorescent material or may reduce the light emission intensity of the resulting nitride fluorescent material. For this reason, the content of the flux in the raw material mixture is in a range of, for example, preferably 10% by mass or less, more preferably 5% by mass or less. The raw material mixture can contain a fluoride such as $SrF_2$ or $EuF_3$. In the case of using such a fluoride, the content of the elemental fluorine contained in the resulting fluorescent material is preferably in a range of 0.1% by mass to 1% by mass.

Heat Treating

The production method according to the present embodiment includes heat treating the raw material mixture in a nitrogen atmosphere to provide the calcined product having a composition represented by the formula (I). The calcined product having the composition represented by the formula (I) can be provided, for example, by heat treating the raw material mixture in an atmosphere containing a nitrogen gas at a temperature in a range of 1000° C. to 1400° C. and a pressure in a range of 0.2 MPa to 200 MPa. Heat treating the raw material mixture at a predetermined temperature under such an atmosphere containing nitrogen gas under pressure can efficiently produce particles of a calcined product that has a desired composition and a high light emission intensity. The particles of the calcined product can also be used as fluorescent material particles.

The raw material mixture prepared so as to attain the composition represented by the formula (I) is heat treated to yield a calcined product. The heat treatment can be performed with a gas pressurizing electric furnace, for example. The heat treatment can be performed at a temperature in a range of 1000° C. or more and 1400° C. or less. The heat treatment temperature is preferably at a temperature in a range of 1000° C. or more and 1300° C. or less, more preferably 1100° C. or more and 1300° C. or less. A heat treatment temperature of 1000° C. or more forms a calcined product having the target compositional ratio. A heat treatment temperature of 1400° C. or less may prevent decomposition of the calcined product, yielding a nitride fluorescent material from the calcined product without impairing the light emitting properties of the nitride fluorescent material.

The heat treatment can also be performed as two-stage calcination (multi-stage calcination) in which a first heat treatment is performed at a temperature in a range of 800° C. or more and 1000° C. or less, and the temperature is gradually raised to perform a second heat treatment at a temperature in a range of 1000° C. or more and 1400° C. or less. The raw material mixture can be heat treated in a crucible a board or the like composed of a material such as carbon (such as graphite), boron nitride (BN), alumina ($Ak_2O_3$), W, or Mo.

A preferred heat treatment atmosphere is an atmosphere containing nitrogen gas. Besides nitrogen gas, the atmosphere containing nitrogen gas may contain at least one selected from the group consisting of hydrogen, argon, carbon dioxide, carbon monoxide, ammonia, and the like. The proportion of nitrogen gas in the heat treatment atmosphere is preferably 70% by volume or more, more preferably 80% by volume or more.

The heat treatment is preferably performed in a pressurized atmosphere in a range of 0.2 MPa or more and 200 MPa or less. The target nitride fluorescent material more readily decomposes at a higher temperature. Such a pressurized atmosphere can provide a nitride fluorescent material having high light emitting properties while preventing decomposition of the nitride fluorescent material. The pressurized atmosphere is preferably in a range of 0.2 MPa or more and 1.0 MPa or less, more preferably in a range of 0.8 MPa or more and 1.0 MPa or less as gauge pressure. An increase in pressure of the gas in the atmosphere during the heat treatment can prevent decomposition of the fluorescent material compound during the heat treatment to yield a fluorescent material having high light emitting properties.

The time for the heat treatment can be appropriately selected according to the heat treatment temperature, the pressure of the gas, and the like. The time for the heat treatment is, for example, in a range of 0.5 hours or more and 20 hours or less, preferably in a range of 1 hour or more and 10 hours or less.

As one example of the production methods of the present embodiment, a method of producing a calcined product includes a designed composition $Sr_{0.993}Eu_{0.007}LiAl_3N_4$ among the nitride fluorescent material including the calcined product having the compositions represented by the formula (I) will now be specifically described. The method of producing a nitride fluorescent material will not be limited to the production method described below.

$SrN_u$ (where u=about ⅔, mixture of $SrN_2$ and SrN), $LiAl_4$, AlN, and $EuF_3$ powders are used as metal compounds contained in the raw material mixture, and are weighed in a glovebox having an inert atmosphere so as to have Sr:Eu:Li:Al=0.9925:0.0075:1.2:3. These powders are mixed to prepare a raw material mixture. At this time, Li is compounded in an amount larger than its theoretical value because Li readily scatters during calcination. The present embodiment will not be limited by the compositional ratio.

The raw material mixture described above is heat treated in the nitrogen atmosphere to obtain particles of calcined product represented by $Sr_{0.993}Eu_{0.007}LiAl_3N_4$. A ratio of each element in the compositional formula is a theoretical composition ratio. Of the constituent elements, elements such as F that may be partially scattered during calcination are not included in the composition formula. As described above, the actual composition contains a certain amount of elemental oxygen. With the use of a fluoride that also can serve as a flux, a certain amount of elemental fluoride can be contained in the calcined product. The ratio of Sr, Eu, and Li in the composition formula is calculated assuming the composition ratio of Al being 3. The ratio of Sr, Eu, and Li in the charging ratio may be different from that in the theoretical composition ratio because those components may be scattered during the heat treatment. A nitride fluorescent material with the target composition ratio can be obtained by varying the compounding proportions of the raw materials.

The calcined product can also be produced by another method. A calcined product having the target composition represented by the formula (I) may be produced as follows: Metal single substances of the elements are weighed so as to have a predetermined compositional ratio, and are then melted into an alloy. The alloy is then pulverized. The pulverized alloy is calcined in a nitrogen gas atmosphere with a gas pressuring calcinating furnace, a hot isostatic pressing (HIP) furnace using HIP, or the like.

Mixing Calcined Product with Polar Solvent

The production methods of the present embodiment each includes a step of mixing the calcined product having a composition represented by the formula (I) with a polar solvent. In the production methods of the present embodiment, particles of the calcined product are dispersed through the step of mixing the calcined product including a composition represented by the formula (I) with a polar solvent. It is considered that, in the process, at least part of surfaces of the particles of the calcined product are affected by the polar solvent and as a result, hydroxides and/or oxides, for example, will be formed on the surfaces of the particles of the calcined product. It can be believed that at least part of the surface of the resulting phosphor contains a compound having a composition different from the composition of the fluorescent material and the refractive index of the phosphor near the surfaces of fluorescent material particles is thus controlled, resulting in increased efficiency in extraction of light, and a light emission intensity from the fluorescent material is thus enhanced. The production methods of the present embodiment each comprise a step of mixing particles of the calcined product including a composition represented by the formula (I) with a polar solvent. In such methods, dispersion of particles of the calcined product and control of the refractive index on the surfaces of the particles of the calcined product can be performed at the same time, efficiently producing a nitride phosphor having a high light emission intensity.

Polar Solvent

In the production methods according to the present embodiment of the present invention, the polar solvent is a polar solvent having a relative dielectric constant in a range of 10 or more and 70 or less at 20° C., or is alcohol and/or ketone containing water in a range of 0.01% by mass or more and 12% by mass or less. The polar solvent has a relative dielectric constant of more preferably 10 or more, still more preferably 15 or more at 20° C. The polar solvent preferably has a relative dielectric constant of 35 or less at 20° C. Even if the polar solvent is alcohol and/or ketone including 0.01% by mass or more and 12% by mass or less of water, the polar solvent preferably has a relative dielectric constant of 10 or more and 35 or less at 20° C. A polar solvent having a relative dielectric constant of less than 10 at 20° C. is not preferred because such a polar solvent has low affinity with water, resulting in poor reaction between the surfaces of the fluorescent material particles and water and a reduction in dispersibility of the calcined product. A polar solvent having a relative dielectric constant of more than 70 at 20° C. is not preferred because such a polar solvent has excessively high affinity with water and thus decomposition of the calcined product (fluorescent material) tends to proceed as a result of a reaction with water.

Examples of the polar solvent having a relative dielectric constant of 10 or more and 70 or less at 20° C. include ethyl acetate, tetrahydrofuran, N,N-dimethylformamide, dimethyl sulfoxide, alcohols having a linear or branched alkyl group having 1 to 8 carbon atoms, carboxylic acids (such as formic acid and acetic acid), and ketones (such as acetone). The polar solvent having a relative dielectric constant of 10 or more and 70 or less at 20° C. is preferably alcohol and/or ketone.

If alcohol and/or ketone is used as the polar solvent, preferred are lower alcohol and/or ketone having a linear or branched alkyl group having 1 to 4 carbon atoms. The polar solvent is more preferably at least one polar solvent selected from the group consisting of methanol (relative dielectric constant: 33), ethanol (relative dielectric constant: 24), 1-propanol (relative dielectric constant: 20), 2-propanol (relative dielectric constant: 18), and acetone (relative dielectric constant: 21). These polar solvents can be used alone or in combination of two or more.

In the production method of one embodiment, the polar solvent may contain water having a relative dielectric constant of 80 at 20° C. The content of water in the polar solvent alcohol and/or ketone is 0.01% by mass or more and 12% by mass or less. The content of water in the polar solvent having a relative dielectric constant of 10 or more and 70 or less at 20° C. is preferably 0.01% by mass or more and 12% by mass or less. The content of water in the polar solvent is more preferably 0.1% by mass or more and 10% by mass or less. The fluorescent material particles are usually dispersed with water in many cases. The nitride fluorescent material including the calcined product having a composition represented by the formula (I), however, tends to be decomposed as a result of a reaction with water in the presence of water exceeding a predetermined amount. In the production methods of the present embodiment, a predetermined amount of water is contained in the polar solvent to form a compound having a composition different from the composition of the nitride fluorescent material on at least part of the surfaces of the particles of the calcined product while preventing decomposition of the calcined product forming the fluorescent material particles. It is believed that the refractive index of the fluorescent material near the surfaces of the fluorescent material particles is controlled, resulting in increased efficiency in extraction of light to the outside of the fluorescent material particles, and a light emission intensity from the fluorescent material can thus be enhanced.

In the production methods of the present embodiment, the particles of the calcined product are preferably stirred in the polar solvent. The particles of the calcined product can be dispersed through stirring of the calcined product in the polar solvent. During stirring of the calcined product in the polar solvent, a dispersion medium such as alumina balls or zirconia balls may be added to promote dispersion of the particles of the calcined product. It is believed that stirring of the calcined product in the polar solvent forms hydroxides and/or oxides on at least part of the surfaces of the particles of the calcined product while the particles are being dispersed. While the polar solvent enhances the light emitting properties of the nitride fluorescent material, a non-polar solvent barely improves the light emitting properties of the nitride fluorescent material. This is probably because while a polar solvent containing water can form hydroxides and/or oxides, for example, on at least part of the surfaces of the fluorescent material particles, an a non-polar solvent has low affinity with water and barely forms hydroxides and/or oxides by water on the surfaces of the fluorescent material particles.

Classifying

The production methods of the present embodiment each may comprise a step of classifying a nitride fluorescent material to yield a nitride fluorescent material having an average particle size of 4.0 µm or more after the step of mixing the calcined product with the polar solvent. The classification step can control the average particle size of the nitride fluorescent material to a predetermined value or higher, yielding a nitride fluorescent material having more enhanced absorptivity of excited light by the nitride fluorescent material and light emission intensity. In the classification step, specifically, a nitride fluorescent material having an average particle size of 4.0 µm or more can be obtained with a method such as sieving, sediment classification in a solution using gravity, or centrifugation. According to the production methods of the present embodiment, a nitride fluorescent material having an average particle size of preferably 4.0 to 20 µm, more preferably 5.0 to 18 µm is obtained through the classification step.

Specific examples of the nitride fluorescent material obtained by the production methods of the present embodiment will be described below. The nitride fluorescent materials obtained by the production methods of the present embodiment each comprise a composition represented by formula (I). In the nitride fluorescent materials obtained by the production methods of the present embodiment, the content of elemental oxygen in the nitride fluorescent material is 2% by mass or more and 4% by mass or less. The nitride fluorescent materials contain the elemental oxygen contained in the hydroxides and/or oxides thought to be formed through mixing of the calcined product with the polar solvent, and may additionally contain the elemental oxygen derived from hydroxides and/or oxides formed on the surfaces of the fluorescent material particles left in the air. It is inferred that extremely slight amounts of hydroxides and/or oxides are generated after the fluorescent material particles are left in the air. The nitride fluorescent materials obtained by the production methods of the present embodiment each comprise a composition represented by formula (I), and may further contain elemental fluorine. It is believed that the fluorine contained in the nitride fluorescent materials is derived from the raw material mixture or the flux described above.

Nitride Fluorescent Material

The nitride fluorescent material according to one embodiment of the present invention include a calcined product having a composition represented by following formula (I):

$$M^a{}_v M^b{}_w M^c{}_x M^d{}_y N_z \quad (I)$$

wherein $M^a$ is at least one element selected from the group consisting of Sr, Ca, Ba, and Mg; $M^b$ is at least one element selected from the group consisting of Li, Na, and K; $M^c$ is at least one element selected from the group consisting of Eu, Mn, Tb, and Ce; $M^d$ is at least one element selected from the group consisting of Al, Si, B, Ga, In, Ge, and Sn, particularly preferably at least one element selected from the group consisting of Al, B, Ga, and In; v, w, x, y, and z are numbers satisfying $0.8 \leq v \leq 1.1$, $0.8 \leq w \leq 1.1$, $0.001 < x \leq 0.1$, $2.0 \leq y \leq 4.0$, and $3.0 \leq z \leq 5.0$, respectively, and having a content of elemental oxygen in a range of 2% by mass or more and 4% by mass or less.

Although not shown in the formula (I), the nitride fluorescent materials according to the present embodiment contain elemental oxygen. It is believed that the elemental oxygen contained in the nitride fluorescent materials according to the present embodiment is mainly derived from hydroxides and/or oxides formed on at least part of the surfaces of the particles of the calcined product through mixing the particles of the calcined product with the polar solvent. The nitride fluorescent materials according to the present embodiment may contain elemental oxygen derived from hydroxides and/or oxides formed on the surfaces of the fluorescent material particles left in the air. Extremely slight amounts of hydroxides and/or oxides are generated after the fluorescent material particles are left in the air. The elemental oxygens in the nitride fluorescent material not shown in the composition represented by the formula (I) may be derived from sources as below:

(1) slight amounts of hydroxides and/or oxides contained in various nitrides, hydrides, metals, and the like used in the raw material mixture, (2) oxides generated through oxidation of the raw material mixture during the heat treatment, and (3) adherents to the nitride fluorescent material after generation.

The elemental oxygen derived from the oxides or the adherents derived from the sources (1) to (3) is contained in an extremely slight amount. The elemental oxygen contained in the nitride fluorescent material of the present embodiment, the elemental oxygen derived from the sources (1) to (3) is contained in an extremely slight amount of less than 0.1% by mass.

In a nitride fluorescent material where oxygen is present, usually, control of the molar ratio of oxygen can change the crystal structure of the fluorescent material to shift the peak fluorescence wavelength of the fluorescent material. From the viewpoint of the higher light emission intensity, however, preferred is a smaller amount of oxygen contained in the nitride fluorescent material. A larger amount of oxygen contained in the nitride fluorescent material will affect not only the surfaces of the fluorescent material particles but also the inside of the fluorescent material particles, resulting in unstable crystal structure of the nitride fluorescent material. Such unstable crystal structure of the nitride fluorescent material tends to reduce the light emission intensity. For this reason, in a nitride fluorescent material containing oxygen, the elemental oxygen is preferably contained near the surface of the nitride fluorescent material.

The content of the elemental oxygen in the nitride fluorescent material according to the present embodiment is 2% by mass or more and 4% by mass or less. The content of the elemental oxygen in the nitride fluorescent material is preferably in a range of 2.2% by mass or more and 3.8% by mass or less, more preferably in a range of 2.5% by mass or more and 3.5% by mass or less. The elemental oxygen contained in an amount of more than 4% by mass in the nitride fluorescent material increases the content of oxygen, which will affect not only the surfaces of the fluorescent material particles but also the inside of the fluorescent material particles, and tends to reduce the light emission intensity. In contrast, it is believed that the elemental oxygen contained in an amount of less than 2% by mass in the nitride fluorescent material cannot form sufficient hydroxides and/or oxides required for an enhancement in extraction of light to the outside of the fluorescent material particles near the surfaces of the fluorescent material particles, and an enhancement in light emission intensity of the nitride fluorescent material tends to be difficult.

The nitride fluorescent material according to the present embodiment may further contain elemental fluorine. The content of the elemental fluorine is preferably in a range of 0.1% by mass or more and 1% by mass or less. The content of the elemental fluorine contained in the nitride fluorescent material is more preferably 0.2% by mass or more and 0.8% by mass or less, still more preferably 0.3% by mass or more and 0.7% by mass or less. It is inferred that the elemental fluorine contained in the nitride fluorescent material is derived from the raw material mixture or the flux described above.

A content of the elemental fluorine in the nitride fluorescent material of 0.1% by mass or more and 1% by mass or less can reduce possibilities that another compound is present in the nitride fluorescent material due to partial decomposition of the nitride fluorescent material, preventing a reduction in light emission intensity of the nitride fluorescent material caused by the presence of another compound.

The nitride fluorescent material according to the present embodiment have an internal quantum efficiency of preferably 80% or more, more preferably 81% or more. Such an internal quantum efficiency can enhance the light emission intensity of the nitride fluorescent material.

The nitride fluorescent material according to the present embodiment have an external quantum efficiency of preferably more than 55%, more preferably of 56% or more. Such an external quantum efficiency can enhance the light emission intensity of the nitride fluorescent material.

In formula (I), $M^a$ preferably contains at least one of Ca and Sr in view of enhancement of the light emission intensity of the nitride fluorescent material. If $M^a$ contains at least one of Ca and Sr, the total molar ratio of Ca and Sr contained in $M^a$ is, for example, 85 mol % or more, preferably 90 mol % or more. In formula (I), $M^b$ preferably contains at least Li in view of the stability of the crystal structure. If $M^b$ contains Li, the molar ratio of Li contained in $M^b$ is, for example, 80 mol % or more, preferably 90 mol % or more. Furthermore, it is preferred in formula (I) that $M^c$ is Eu and $M^d$ is Al. In formula (I), if $M^c$ is Eu and $M^d$ is Al, a nitride fluorescent material having a narrow half bandwidth in the light emission spectrum and a desired wavelength region can be obtained.

In formula (I), v, w, x, y, and z can be any number as long as the numeric value ranges shown above are satisfied. v and w are preferably in a range of 0.8 or more and 1.1 or less and in a range of 0.9 or more and 1.05 or less, respectively, in view of the stability of the crystal structure. x is an Eu activating amount, which may be appropriately selected so as to achieve desired properties. x is a number satisfying $0.001 < x \leq 0.1$, preferably $0.001 < x \leq 0.02$, more preferably $0.002 \leq x \leq 0.015$. y is a number satisfying $2.0 \leq y \leq 4.0$, preferably $2.0 \leq y \leq 3.5$ in view of the stability of the crystal structure. z is also a number satisfying $3.0 \leq z \leq 5.0$, preferably $3.0 \leq z \leq 4.0$ in view of the stability of the crystal structure.

The nitride fluorescent material according to the present embodiment may contain impurities not shown in the composition represented by formula (I). Such impurities that may be present in the nitride fluorescent material are selected from the group consisting of Sc, Y, Ti, Zr, V, Nb, Cr, Mo, Mn, Fe, Ru, Sm, Gd, Tb, Dy, Ho, Er, Tm, Yb, Hf, Ta, W, Re, Os, Ir, Pt, Tl, Pb, and Bi.

The nitride fluorescent material according to the present embodiment absorb light at a wavelength in a range of 400 nm or more and 570 nm or less, which corresponds to ultraviolet light to visible light in a shorter wavelength region, and emit fluorescence having a peak fluorescence wavelength in a range of 630 nm or more and 670 nm or less. A fluorescent material having a high light emission intensity can be provided with an excitation light source having a wavelength in this range. The excitation light source used has a main peak light emission wavelength preferably at 420 nm or more and 500 nm or less, more preferably 420 nm or more and 460 nm or less.

The light emission spectrum of the nitride fluorescent material has a peak fluorescence wavelength in a range of 630 nm or more and 670 nm or less, preferably 640 nm or more and 660 nm or less. The half bandwidth in the light emission spectrum is, for example, 65 nm or less, preferably 60 nm or less. The lower limit of the half bandwidth is 45 nm or more, for example.

The nitride fluorescent material has a light emission center $M^c$. If $M^c$ is europium (Eu), which is one of rare earth elements, europium (Eu) is the center of light emission. In the present embodiment, the center of light emission is not limited to only europium. Europium in the center of light emission may partially be replaced with another rare earth metal element or an alkaline earth metal element. Europium and another element can be used as a co-activator. A divalent rare earth element ion $Eu^{2+}$ stably emits light by appropriate selection of a matrix crystal.

The nitride fluorescent material has an average particle size of, for example, 4.0 µm or more, preferably 4.5 µm or more, more preferably 5.0 µm or more. The average particle size is, for example, 20 µm or less, preferably 18 µm or less.

An average particle size of a predetermined value or greater tends to provide a nitride fluorescent material having enhanced absorptivity of excited light and having enhanced light emission intensity. As above, a nitride fluorescent material having a high light emitting properties contained in a light-emitting device described later enhances the light emission efficiency of the light-emitting device. An average particle size of a predetermined value or smaller can enhance the workability during the steps of producing a light-emitting device.

Fluorescent material particles having the average particle size are preferably contained in the nitride fluorescent material with a high frequency. In other words, the nitride fluorescent material preferably has narrow particle size distribution. By using a fluorescent material having small variations in size of particles, a light-emitting device having reduced color unevenness and a good color tone can be obtained.

Throughout the specification, the average particle size of the nitride fluorescent material and the average particle sizes of other fluorescent materials are volume average particle sizes (median particle sizes) measured with a laser diffraction particle size distribution analyzer (MASTER SIZER 2000 made by Malvern Instruments Ltd.).

The nitride fluorescent material preferably has a crystal structure in most part of the particles. For example, a glass (amorphous) material has a loose structure so that the composition ratio in the fluorescent material may not be constant, which may lead to uneven chromaticity. To avoid this, it is necessary arises to control the reaction conditions in the manufacturing process to avoid the above. The fluorescent material having a crystal structure in most part of the particles facilitates production and processing. Such a nitride fluorescent material is readily uniformly dispersed in a resin, and therefore can facilitate formation of a sealing member described later. The content of the crystal structure in the fluorescent material particles shows the percentage of crystalline phase which has luminescent properties. The fluorescent material has crystalline phase of at least 50% by mass or more, more preferably 80% by mass or more. Emission sufficient for practical application can be obtained with the content of crystal phase of 50% by mass or more.

Light-Emitting Device

A light-emitting device including the nitride fluorescent material as a wavelength converting member will now be described. The light-emitting device according to an embodiment of the present invention comprises the nitride fluorescent material and an excitation light source. The excitation light source preferably emits light at a wavelength in a range of 400 nm or more and 570 nm or less.

The excitation light source can use a light-emitting element. The light-emitting element emits light at a wavelength in a range of 400 nm or more and 570 nm or less. The peak light emission wavelength of the light-emitting element lies preferably in the wavelength range of 420 nm or more and 460 nm or less. Using a light-emitting element having a peak light emission wavelength in this range as an excitation light source yields a light-emitting device that emits light resulting from a mix of the light from the light-emitting element and the fluorescence from the fluorescent materials. Because this allows effective use of a part of the light radiated from the light-emitting element to the outside as light for the light-emitting device, therefore achieving a light-emitting device having a high light emission efficiency can be obtained.

A preferred light-emitting element to be used is, for example, a semiconductor light-emitting element including a nitride semiconductor ($In_XAl_YGa_{1-X-Y}N$, where $0 \leq X$, $0 \leq Y$, $X+Y \leq 1$), which emits of blue or green light. Using a semiconductor light-emitting element as an excitation light source provides a highly efficient light emitting device that has high linearity to the input, and is resistant and stable to mechanical impact. The half bandwidth of the light emission spectrum of the light emitting element can be 30 nm or less, for example.

A first fluorescent material contained in the light-emitting device comprises the nitride fluorescent material. The nitride fluorescent material comprise the composition represented by the formula (I), is excited by light at a wavelength in a range of 400 nm or more and 570 nm or less, and has a peak light emission wavelength in a range of 630 nm or more and 670 nm or less.

The first fluorescent material, contained in a sealing resin covering the excitation light source, for example, can constitute the light-emitting device. In the light-emitting device including an excitation light source covered with an sealing resin containing the first fluorescent material, light emitted from the excitation light source is partially absorbed by the first fluorescent material, and red light is emitted. More effective use of the emitted light is enabled by using an excitation light source emitting light at a wavelength in a range of 400 nm or more and 570 nm or less. As a result, the loss of light emitted from the light-emitting device can be reduced, providing a light-emitting device having a high light emission efficiency.

The content of the first fluorescent material contained in the light-emitting device can be, for example, from 1 part by mass to 50 parts by mass, preferably from 2 parts by mass to 30 parts by mass relative to 100 parts by mass of the sealing resin.

The light-emitting device may incorporate a second fluorescent material that has a range of a peak fluorescence wavelength different from that of the first fluorescent material. For example, the light-emitting device incorporating a light-emitting element emitting blue light and the first fluorescent material and the second fluorescent material excited by the blue light from the light-emitting element can be achieved a wide range of color reproducibility and good color rendering.

Examples of the second fluorescent material can include fluorescent materials having a compositions represented by any one of the following formulae (IIa), (IIb), (IIc), (IId), (IIe), (IIf), (IIg), (IIh) and (IIi). For example, the second fluorescent material more preferably contains at least one fluorescent material having a composition represented by one formula selected from formulae (IIc), (IIe), (IIh) and (IIi) to achieve a wide range color reproducibility.

$$(Y,Gd,Tb,Lu)_3(Al,Ga)_5O_{12}:Ce \qquad (IIa)$$

$$(Ba,Sr,Ca)_2SiO_4:Eu \qquad (IIb)$$

$$Si_{6-p}Al_pO_pN_{8-p}:Eu \text{ (where } 0<p\leq4.2) \qquad (IIc)$$

$$(Ca,Sr)_8MgSi_4O_{16}(Cl,F,Br)_2:Eu \qquad (IId)$$

$$(Ba,Sr,Ca)Ga_2S_4:Eu \qquad (IIe)$$

$$(Ba,Sr,Ca)_2Si_5N_8:Eu \qquad (IIf)$$

$$(Sr,Ca)AlSiN_3:Eu \qquad (IIg)$$

$$K_2(Si,Ge,Ti)F_6:Mn \qquad (IIh)$$

$$(Ba,Sr)MgAl_{10}O_{17}:Mn \qquad (IIi)$$

The second fluorescent material has an average particle size in a range of preferably 2 μm or more and 35 μm or less, more preferably 5 μm or more and 30 μm or less. An average particle size having a predetermined value or greater can more significantly enhance the light emission intensity from the second fluorescent material. An average particle size having a predetermined value or less can enhance the workability during the steps of producing the light-emitting device.

The amount of the second fluorescent material may be appropriately selected according to the purpose. The amount of the second fluorescent material may be, for example, from 1 part by mass to 200 parts by mass, preferably from 2 parts by mass to 180 parts by mass relative to 100 parts by mass of the sealing resin.

The ratio of the first fluorescent material to the second fluorescent material (first fluorescent material/second fluorescent material) may be 0.01 to 5, preferably 0.05 to 3 in mass ratio.

The first fluorescent material and the second fluorescent material (hereinafter, also collectively simply referred to as "fluorescent material") with the sealing resin preferably form a sealing member covering the light-emitting element.

Examples of the sealing resin contained in the sealing member may include epoxy resins and silicone resins.

The total content of the fluorescent materials in the sealing member may be, for example, from 5 parts by mass to 300 parts by mass, preferably from 10 parts by mass to 250 parts by mass, more preferably from 15 parts by mass to 230 parts by mass, still more preferably from 15 parts by mass to 200 parts by mass relative to 100 parts by mass of the sealing resin.

Besides the sealing resin and the fluorescent materials, the sealing member may further contain a filler, a light diffusing material, and the like. Examples of the filler and the light diffusing material can include silica, titanium oxide, zinc oxide, zirconium oxide, and alumina. In a sealing member containing a filler, the content can be appropriately selected according to the purpose, etc. The amount of the filler may be from 1 part by mass to 20 parts by mass relative to 100 parts by mass of the sealing resin, for example.

An example of the light-emitting device according to the present embodiment will be described with reference to the drawing. FIG. 1 is a schematic cross-sectional view of an exemplary light-emitting device according to the present embodiment.

A light-emitting device 100 includes a package 40 having a recessed part, a light-emitting element 10, and a sealing member 50 covering the light-emitting element 10. The light-emitting element 10 is disposed in the recessed part formed in the package 40, and is electrically connected through a conductive wire 60 to a pair of positive and negative lead electrodes 20 and 30 disposed in the package 40. The sealing member 50 is formed of a sealing resin containing a fluorescent material 70 and filled into the depressed portion to cover the light-emitting element 10. The sealing member 50 comprises a sealing resin, and a fluorescent material 70 converting the wavelength of light from the light-emitting element 10, for example. Furthermore, the fluorescent material 70 contains a first fluorescent material 71 and a second fluorescent material 72. The pair of positive and negative lead electrodes 20 and 30 is partially exposed to the exterior surfaces of the package 40. The light-emitting device 100 emits light as a result of receiving external electricity through these lead electrodes 20 and 30 to the light-emitting device 100.

The sealing member 50 functions not only as a wavelength converting member but also a member protecting the light-emitting element 10, the first fluorescent material 71, and the second fluorescent material 72 from an external environment. In FIG. 1, the first fluorescent material 71 and the second fluorescent material 72 are lopsided in the sealing member 50. Arranging the first fluorescent material 71 and the second fluorescent material 72 disposed close to the light-emitting element 10, as illustrated, enables efficient wavelength conversion of the light from the light-emitting element 10, and the light-emitting device of excellent luminous efficiency can be obtained. The arrangement of the sealing member 50 containing the first fluorescent material 71 and the second fluorescent material 72 and the light-emitting element 10 will not be limited to the arrangement where the first fluorescent material 71 and the second fluorescent material 72 are disposed close to the light-emitting element 10. Considering influences on the first fluorescent material 71 and the second fluorescent material 72 by heat, the first fluorescent material 71 and the second fluorescent material 72 can be arranged spaced from the light-emitting element 10 in the sealing member 50. The first fluorescent material 71 and the second fluorescent material 72 can also be almost homogeneously dispersed all over the sealing member 50 to generate light having reduced unevenness of color.

EXAMPLES

The present invention will be more specifically described by way of Examples, but the present invention will not be limited to these Examples.

Production Example 1

To yield a nitride fluorescent material including a calcined product having a composition represented by $M^a{}_v M^b{}_w M^c{}_x M^d{}_y N_z$ where $M^a$ was Sr, $M^b$ was Li, $M^c$ was Eu, and $M^d$ was Al, raw materials SrN$_u$ (where u=about ⅔, mixture of SrN$_2$ and SrN), SrF$_2$, LiAlH$_4$, AlN, and EuF$_3$ were used. These raw materials were weighed in a glovebox in an inert atmosphere so as to have a molar ratio Sr:Li:Eu:Al=0.9925:1.2:0.0075:3 as the ratio of the amounts of prepared, and were mixed to prepare a raw material mixture. At this point, the mass ratio of SrN$_u$ to SrF$_2$ was set to 94:6. An amount of Li larger than that in the target composition was compounded because Li readily scatters during calcination. The raw material mixture was charged into a crucible, and was heat treated for three hours in a nitrogen gas atmosphere at a gas pressure (gauge pressure) of 0.92 MPa (absolute pressure of 1.02 MPa) and a temperature of 1100° C. to yield powdery calcined product 1.

Example 1

30 g of the calcined product 1 obtained in Production Example 1 was added to 80 ml of ethanol (purity: 99.5% or more, relative dielectric constant at 20° C.: 24, moisture content: 0.03% by mass), and was stirred for three hours. After stirring, coarse particles and microfine particles were removed through classification. The resulting particles were dried to yield a nitride fluorescent material of Example 1 having an adjusted average particle size (Dm) shown in Table 1.

Comparative Example 1

The calcined product 1 prepared in Production Example 1 was used as the nitride fluorescent material of Comparative Example 1.

Example 2

A nitride fluorescent material of Example 2 was prepared on the same conditions as those in Example 1 except that pure water was added such that the content of water in ethanol was 1% by mass.

Example 3

A nitride fluorescent material of Example 3 was prepared on the same conditions as those in Example 1 except that pure water was added such that the content of water in ethanol was 5% by mass.

Example 4

A nitride fluorescent material of Example 4 was prepared on the same conditions as those in Example 1 except that pure water was added such that the content of water in ethanol was 10% by mass.

Comparative Example 2

A nitride fluorescent material of Comparative Example 2 was prepared on the same conditions as those in Example 1 except that pure water was added such that the content of water in ethanol was 12.5% by mass.

Comparative Example 3

A nitride fluorescent material of Comparative Example 3 was prepared on the same conditions as those in Example 1 except that pure water was added such that the content of water in ethanol was 15.0% by mass.

Comparative Example 4

A nitride fluorescent material of Comparative Example 4 was prepared on the same conditions as those in Example 1 except that pure water was added such that the content of water in ethanol was 17.5% by mass.

Comparative Example 5

A nitride fluorescent material of Comparative Example 5 was prepared on the same conditions as those in Example 1 except that pure water was added such that the content of water in ethanol was 20% by mass.

Comparative Example 6

A nitride fluorescent material of Comparative Example 6 was prepared on the same conditions as those in Example 1 except that pure water was added such that the content of water in ethanol was 50% by mass.

Example 5

A nitride fluorescent material of Example 5 was prepared on the same conditions as those in Example 1 except that ethanol was replaced with 2-propanol (purity: 99.7% or more, relative dielectric constant at 20° C.: 18, moisture content: 0.11% by mass).

Comparative Example 7

A nitride fluorescent material of Comparative Example 7 was prepared on the same conditions as those in Example 1 except that ethanol was replaced with hexane (purity: 96% or more, relative dielectric constant at 20° C.: 2, moisture content: less than 0.01% by mass).

Evaluation

X-Ray Diffraction Spectrum

Figure 2:
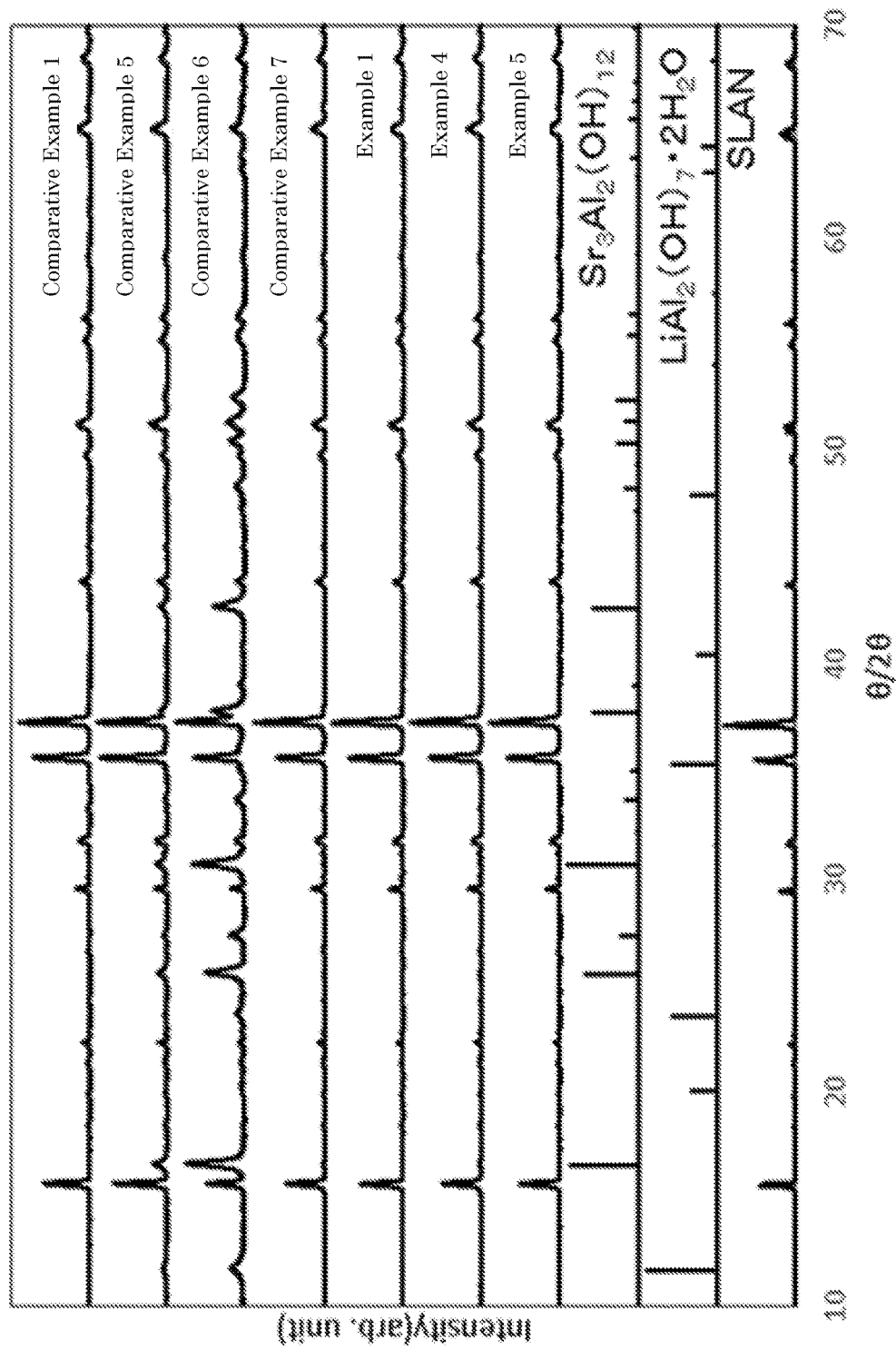
FIG. 2 shows X-ray diffraction patterns of the nitride fluorescent materials according to Examples and Comparative Examples, and X-ray diffraction patterns of $Sr_3Al_2(OH)_{12}$, $LiAl_2(OH)_7 \cdot 2H_2O$, and a compound (SLAN) represented by $SrLiAl_3N_4$.

The nitride fluorescent materials prepared above were measured to obtain the X-ray diffraction spectra (XRD). The measurement was performed with a sample leveling type multi-purpose X-ray diffraction apparatus (product name: UltimaIV, manufactured by Rigaku Corporation) using CuKα rays. The examples of the resulting XRD patterns are shown in FIG. 2.

Average Particle Size

The average particle sizes of the nitride fluorescent material prepared above were measured with a laser diffraction particle size distribution analyzer (MASTER SIZER 2000 manufactured by MALVERN Instruments Ltd.). The results are shown in Table 1.

Light Emitting Properties

Figure 3:
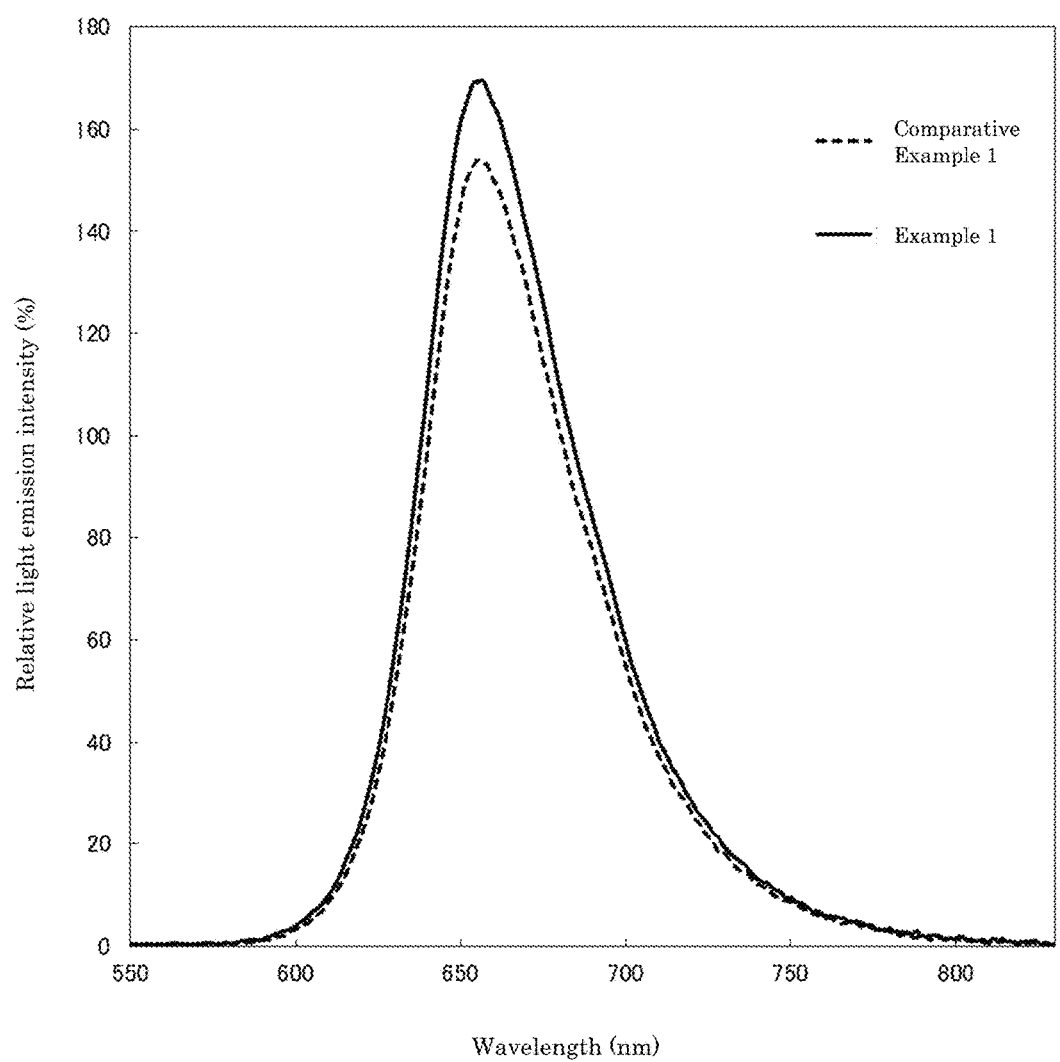
FIG. 3 shows light emission spectra of nitride fluorescent materials according to Example 1 and Comparative Example 1, showing a relative light emission intensity to a wavelength.

The light emitting properties of the nitride fluorescent material prepared above were measured. The light emitting properties of the powder of the nitride fluorescent material were measured with a spectrofluorometer QE-2000 (manufactured by Otsuka Electronics Co., Ltd.) using excited light having a wavelength of 450 nm. From the light emission spectra obtained in the measurement, the relative light emission intensity Ip (%), the peak fluorescence wavelength λp (nm), the internal quantum efficiency (%), and the external quantum efficiency (%) were determined. The results are shown in Table 1. The relative light emission intensity Ip (%) was calculated where the nitride fluorescent material of Comparative Example 1 was used as the reference. FIG. 3 illustrates the light emission spectra of the nitride fluorescent material prepared in Comparative Example 1 and Example 1. In FIG. 3, each light emission spectrum represents a relative light emission intensity to the wavelength.

Compositional Analysis

The composition ratios (molar ratio) of elements Sr, Li, Eu, Al and N of the nitride fluorescent material prepared above were measured with an inductively coupled plasma light emission analyzer (manufactured by PerkinElmer Inc.) by ICP light emission analysis. The amounts (% by mass) of O and F of the nitride fluorescent material prepared above were measured with an oxygen-nitrogen analyzer manufactured by HORIBA, Ltd. The results are shown in Table 2. The compositional ratio (mole ratio) of each element was a value obtained by calculating when the composition ratio (mole ratio) of Al, which is 3, as a reference.

SEM Images

Figure 4:
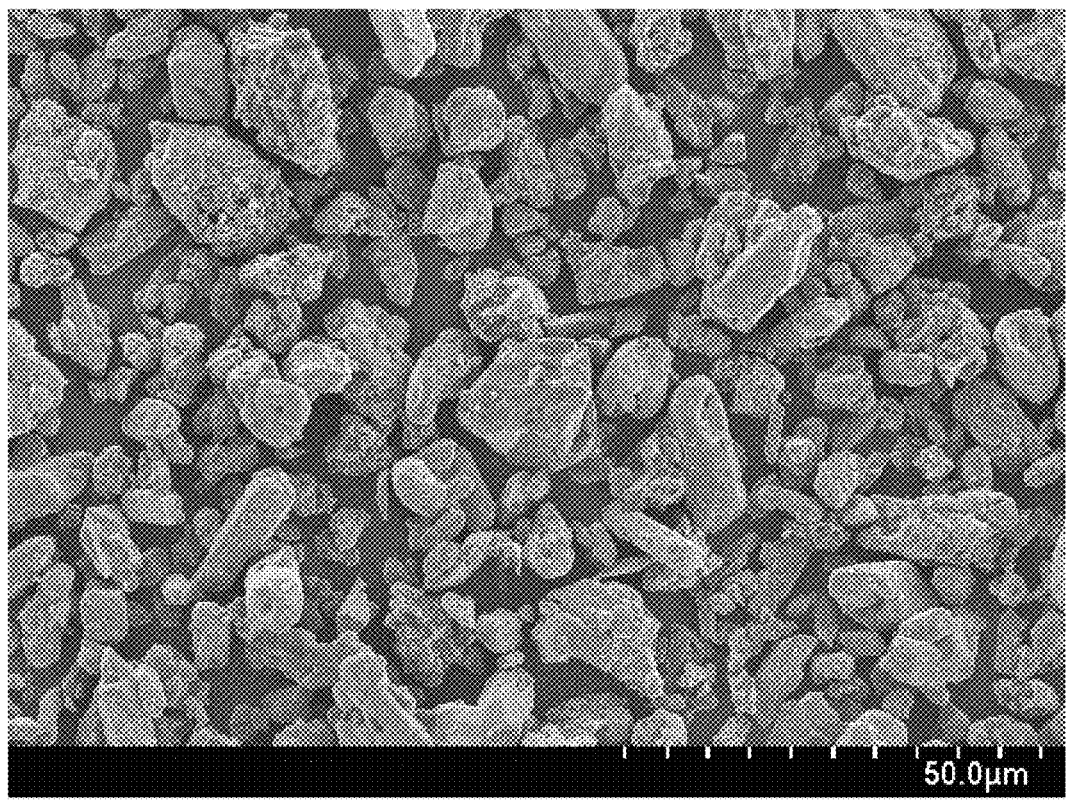
FIG. 4 is an SEM image of the nitride fluorescent material according to Example 1.
Figure 5:
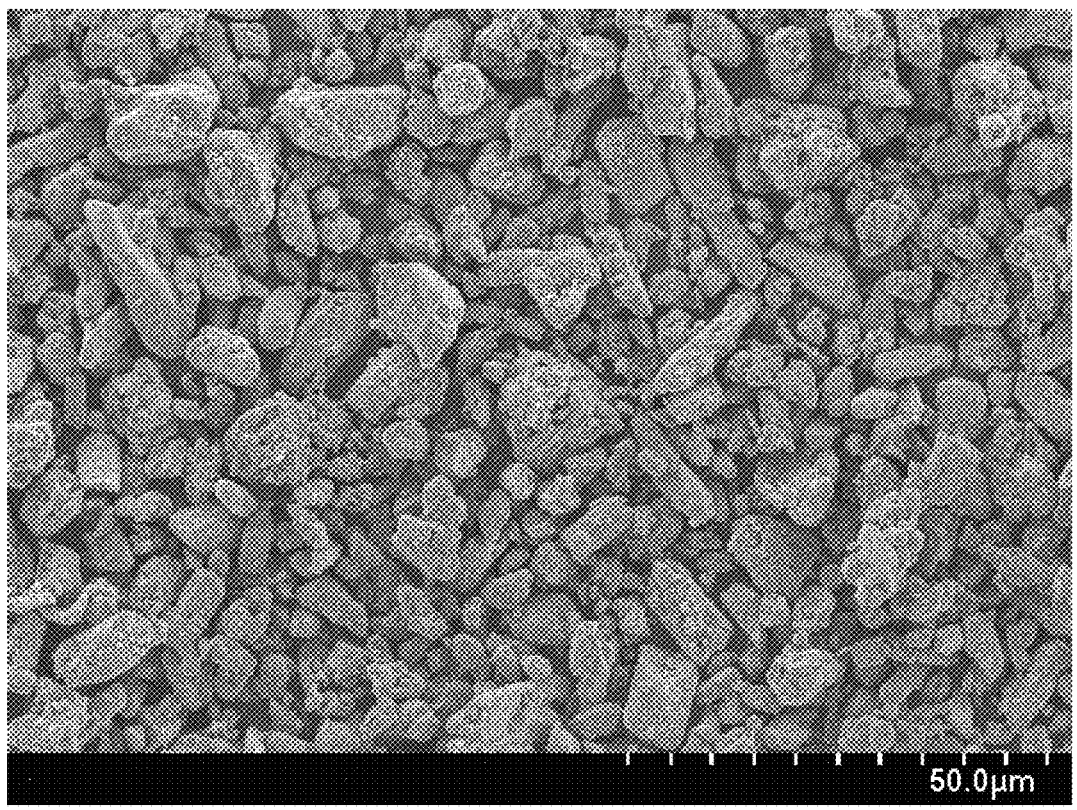
FIG. 5 is an SEM image of the nitride fluorescent material according to Example 4.
Figure 6:
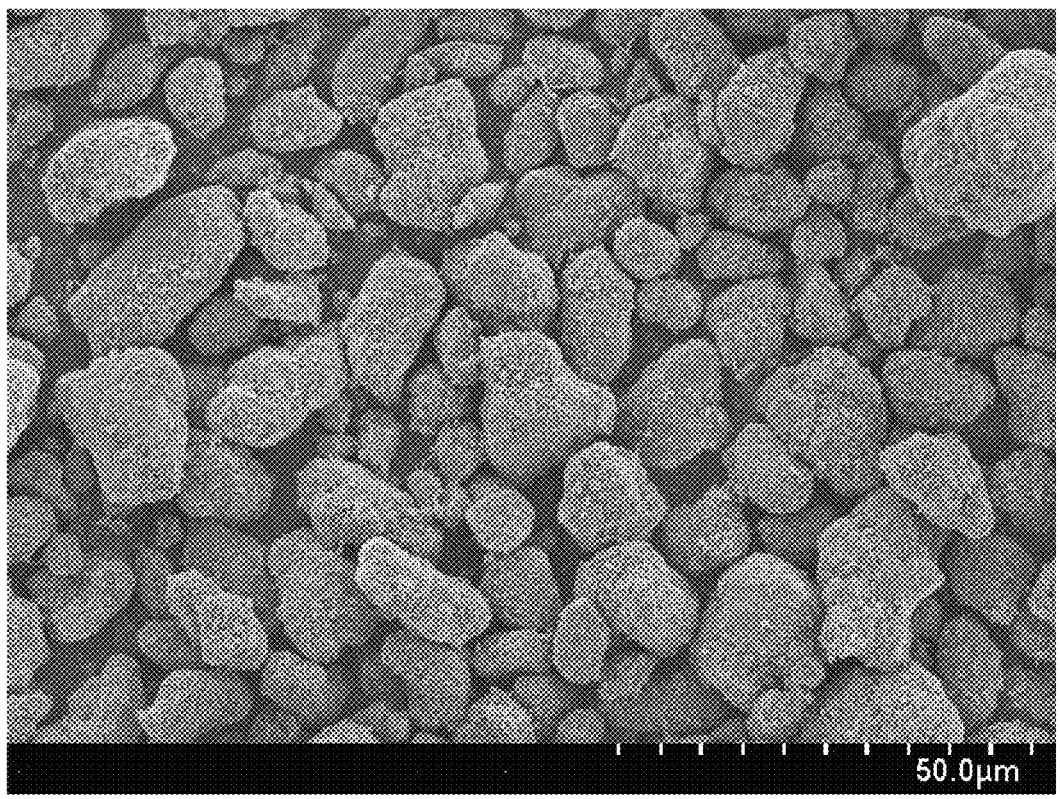
FIG. 6 is an SEM image of the nitride fluorescent material according to Comparative Example 6.

SEM images of the nitride fluorescent material of Example 1, Example 4, and Comparative Example 6 were obtained with a scanning electron microscope (SEM). FIG. 4 is an SEM image of the nitride fluorescent material of Example 1; FIG. 5 is an SEM image of the nitride fluorescent material of Example 4; and FIG. 6 is an SEM image of the nitride fluorescent material of Comparative Example 6.

TABLE 2

| | Compositional ratio (mole ratio) | | | | | Mass ratio (% by mass) | |
|---|---|---|---|---|---|---|---|
| | Sr | Eu | Li | Al | N | O | F |
| Comparative Example 1 | 1.019 | 0.007 | 1.032 | 3.000 | 3.527 | 1.65 | 0.65 |
| Example 1 | 1.001 | 0.007 | 1.013 | 3.000 | 3.568 | 2.86 | 0.52 |
| Example 2 | 1.012 | 0.007 | 1.037 | 3.000 | 3.569 | 3.27 | 0.53 |
| Example 3 | 0.988 | 0.007 | 1.016 | 3.000 | 3.572 | 2.60 | 0.50 |
| Example 4 | 1.005 | 0.007 | 0.993 | 3.000 | 3.500 | 3.42 | 0.52 |
| Comparative Example 2 | 1.074 | 0.008 | 1.086 | 3.000 | 2.679 | 12.18 | 0.01 |
| Comparative Example 3 | 1.095 | 0.008 | 1.081 | 3.000 | 1.820 | 19.00 | 0.01 |
| Comparative Example 4 | 1.072 | 0.008 | 1.084 | 3.000 | 2.172 | 17.95 | 0.01 |
| Comparative Example 5 | 1.035 | 0.007 | 1.060 | 3.000 | 2.018 | 16.82 | 0.07 |
| Comparative Example 6 | 1.082 | 0.008 | 1.023 | 3.000 | 1.011 | 19.14 | 0.07 |
| Example 5 | 1.001 | 0.007 | 1.013 | 3.000 | 3.521 | 2.53 | 0.50 |
| Comparative Example 7 | 1.020 | 0.007 | 1.067 | 3.000 | 3.260 | 5.81 | 0.46 |

The results of the relative light emission intensity shown in Table 1 show that Examples 1 to 5 each have a relative light emission intensity higher than that of Comparative Example 1. The light emission spectra shown in FIG. 3 show that Example 1 has a relative light emission intensity higher than that of Comparative Example 1. Table 1 also shows that the internal quantum efficiencies of Examples 1 to 5 are each 80% or more, and are higher than those of Comparative Examples 1 and 5 to 7. The external quantum efficiencies of Examples 1 to 5 are each 58% or more, and are higher than those of Comparative Examples. Examples 1 to 5 have enhanced light conversion efficiency. Using these fluorescent material in light-emitting devices can provide light-emitting devices generating higher luminous flux. In Comparative Examples 2 to 4 using the polar solvent in which the content of water was more than 12% by mass, the external quantum efficiency was 55% or less, and the relative light

TABLE 1

| | Organic solvent | Moisture content: (% by mass) | Average particle size Dm (μm) | Peak fluorescence wavelength λp (nm) | Relative light emission intensity Ip (%) | Internal quantum efficiency (IQE) (%) | External quantum efficiency (EQE) (%) |
|---|---|---|---|---|---|---|---|
| Comparative Example 1 | None | — | 20.8 | 656 | 100.0 | 77.0 | 55.0 |
| Example 1 | Ethanol | 0.03 | 9.1 | 656 | 110.1 | 81.7 | 58.7 |
| Example 2 | | 1.00 | 8.9 | 656 | 108.1 | 82.3 | 58.9 |
| Example 3 | | 5.00 | 8.8 | 656 | 110.2 | 83.0 | 60.5 |
| Example 4 | | 10.00 | 8.7 | 656 | 109.4 | 82.9 | 59.8 |
| Comparative Example 2 | | 12.50 | 8.7 | 654 | 96.8 | 85.8 | 53.3 |
| Comparative Example 3 | | 15.00 | 7.7 | 654 | 88.9 | 85.5 | 49.2 |
| Comparative Example 4 | | 17.50 | 9.5 | 654 | 95.3 | 83.8 | 51.6 |
| Comparative Example 5 | | 20.00 | 9.8 | 652 | 96.6 | 79.4 | 50.2 |
| Comparative Example 6 | | 50.00 | 17.1 | 652 | 72.0 | 68.8 | 39.5 |
| Example 5 | 2-Propanol | 0.11 | 8.8 | 656 | 109.7 | 81.9 | 58.3 |
| Comparative Example 7 | Hexane | <0.01 | 10.4 | 656 | 100.8 | 79.0 | 54.9 | emission intensity was reduced. As shown in Comparative Examples 5 and 6, it is inferred that a content of water of 20% by mass or more in the polar solvent proceeds decomposition of fluorescent material particles with water. The internal quantum efficiency was less than 80%, and the external quantum efficiency was 55% or less. The light conversion efficiency and the relative light emission intensity were also reduced.

FIG. 2 sequentially illustrates the XRD patterns of Comparative Example 1, Comparative Example 5, Comparative Example 6, Comparative Example 7, Example 1, Example 4, Example 5, and as references, $Sr_3Al_2(OH)_{12}$, $LiAl_2(OH)_7 \cdot 2H_2O$, and a compound (SLAN) represented by $SrLiAl_3N_4$. The XRD patterns shown in FIG. 2 confirmed that the compounds of Comparative Examples 1 and 5 to 7 and Examples 1, 4, and 5 had XRD patterns similar to the XRD pattern of SLAN, and these compounds all comprise a composition represented by $SrLiAl_3N_4$. In Comparative Examples 5 and 6, in addition to $SrLiAl_3N_4$, peaks derived from $Sr_3Al_2(OH)_{12}$, $LiAl_2(OH)_7 \cdot 2H_2O$, etc. were present. This suggests that the fluorescent material particles were partially decomposed. As shown in FIG. 2, in Comparative Examples 5 and 6, a small amount of a different compound was present in addition to $SrLiAl_3N_4$. For this reason, it is believed that the target compounds were partially decomposed to reduce the relative light emission intensity and the internal quantum efficiency. In Comparative Example 7, ethanol was replaced with hexane having a relative dielectric constant at 20° C. of 2. The relative light emission intensity in Comparative Example 7 was not as high as those of Examples 1 to 5, and the internal quantum efficiency was similar to those of other Comparative Examples. The light emitting properties were not improved.

The compositional ratios (mole ratio) of elements Sr, Li, Eu, Al and N shown in Table 2 are values obtained by calculating the composition ratio (mole ratio) Al, which is 3, as a reference. The ratios of the oxygen (O) element and the fluorine (F) element are represented as the mass ratio (% by mass). In Examples 1 to 5, the content of the oxygen (O) element is larger than in Comparative Example 1, and is 2 to 4% by mass. It is believed that the content of the elemental oxygen in the fluorescent material particles is increased because the calcined product particles were dispersed in the polar solvent having a relative dielectric constant in a range of 10 or more and 70 or less at 20° C. to increase the specific surface areas of the particles that come in contacted with the polar solvent, and as a result, the surfaces of the fluorescent material particles are strongly affected by the polar solvent. In Examples 1 to 5, the compositional ratio (mole ratio) of Eu barely changed from the ratio of the prepared amount, and the composition ratios (mole ratios) of Sr and Li slightly changed from the ratios of the prepared amounts. Although it is believed that Li relatively significantly reduces from the prepared amount during the heat treatment, the composition ratio (mole ratio) of the element Li in the fluorescent material shows that the composition barely changed by solvent treatment with the polar solvent. In Comparative Examples 2 to 6, the nitride fluorescent material particles partially decomposed as described in the X-ray diffraction spectrum (XRD), because the calcined product particles were dispersed in the polar solvent containing a relatively large amount of water. It is believed that the fluorine (F) element contained in the calcined product particles reacted with an excess water to remove the elemental fluorine, and as a result, the content of the fluorine (F) element was smaller than in Comparative Example 1.

Any apparently great difference cannot be found between the SEM image of the nitride fluorescent material of Example 1 shown in FIG. 4 and the SEM image of the nitride fluorescent material of Example 4 shown in FIG. 5. In contrast, it is confirmed from the SEM image of the nitride fluorescent material of Comparative Example 6 shown in FIG. 6 that the nitride fluorescent material had a rough surface. From comparison between the SEM images of FIG. 4 and FIG. 5 and the SEM image of FIG. 6, it is inferred that the nitride fluorescent material of Example 1 and 4 had relatively smooth surfaces while the nitride fluorescent material of Comparative Example 6 in FIG. 6 had a rough surface because the nitride fluorescent material partially decomposed.

The nitride fluorescent material of the present embodiment have high light emission intensity. Use of these nitride fluorescent material can provide light-emitting devices generating higher luminous flux.

INDUSTRIAL APPLICABILITY

Light-emitting devices containing the nitride fluorescent material according to the present disclosure can be suitably used as light sources for lighting. These light-emitting devices can be particularly suitably used in light sources for lighting including light emitting diodes as excitation light sources and having extremely high light emitting properties, LED displays, backlight light sources for liquid crystal displays, traffic signals, lighting switches, a variety of sensors, a variety of indicators, and the like.

It is to be understood that although the present disclosure has been described with regard to preferred embodiments thereof, various other embodiments and variants may occur to those skilled in the art, which are within the scope and spirit of the disclosure, and such other embodiments and variants are intended to be covered by the following claims.

All publications, patent applications, and technical standards mentioned in this specification are herein incorporated by reference to the same extent as if each individual publication, patent application, or technical standard was specifically and individually indicated to be incorporated by reference.

What is claimed is:

1. A method of producing a nitride fluorescent material, the nitride fluorescent material comprising a calcined product having a composition represented by a formula (I):

$$M^a_v M^b_w M^c_x M^d_y N_z \qquad (I)$$

wherein $M^a$ is at least one element selected from the group consisting of Sr, Ca, Ba, and Mg; $M^b$ is at least one element selected from the group consisting of Li, Na, and K; $M^c$ is at least one element selected from the group consisting of Eu, Mn, Tb, and Ce; $M^d$ is at least one element selected from the group consisting of Al, B, Ga, and In; v, w, x, y, and z are numbers satisfying $0.8 \leq v \leq 1.1$, $0.8 \leq w \leq 1.1$, $0.001 < x \leq 0.1$, $2.0 \leq y \leq 4.0$, and $3.0 \leq z \leq 5.0$, respectively, and having a content of elemental oxygen in a range of 2% by mass or more and 4% by mass or less, the method comprising:

providing a calcined product having the composition represented by the formula (I); and mixing the calcined product with a polar solvent having a relative dielectric constant in a range of 10 to 70 at 20° C.

2. The method of producing a nitride fluorescent material according to claim 1, wherein the polar solvent further comprises water, and a content of water in the polar solvent is in a range of 0.01% by mass or more and 12% by mass or less.

3. The method of producing a nitride fluorescent material according to claim 2, wherein the content of water in the polar solvent is in a range of 0.1% by mass or more and 10% by mass or less.

4. The method of producing a nitride fluorescent material according to claim 1, wherein the polar solvent has a relative dielectric constant in a range of 10 or more and 35 or less at 20° C.

5. The method of producing a nitride fluorescent material according to claim 1, wherein the polar solvent is alcohol and/or ketone.

6. The method of producing a nitride fluorescent material according to claim 1, wherein the polar solvent is at least one selected from the group consisting of methanol, ethanol, 1-propanol, 2-propanol, and acetone.

7. The method of producing a nitride fluorescent material according to claim 1, comprising, after the steps, a step of classifying the calcined product to yield a nitride fluorescent material having an average particle size of 4.0 µm or more.

8. The method of producing a nitride fluorescent material according to claim 1, wherein in the formula (I), $M^a$ comprises at least one of Sr and Ca, $M^b$ comprises Li, $M^c$ is Eu, and $M^d$ is Al.

9. A method of producing a nitride fluorescent material, the nitride fluorescent material comprising elemental oxygen in a range of 2% by mass or more and 4% by mass or less, the method comprising the steps of:

preparing a calcined product having a composition represented by following formula (I):

$$M^a{}_v M^b{}_w M^c{}_x M^d{}_y N_z \quad \text{(I)}$$

wherein $M^a$ is at least one element selected from the group consisting of Sr, Ca, Ba, and Mg; $M^b$ is at least one element selected from the group consisting of Li, Na, and K; $M^c$ is at least one element selected from the group consisting of Eu, Mn, Tb, and Ce; $M^d$ is at least one element selected from the group consisting of Al, B, Ga, and In; and v, w, x, y, and z are numbers satisfying $0.8 \le v \le 1.1$, $0.8 \le w \le 1.1$, $0.001 < x \le 0.1$, $2.0 \le y \le 4.0$, and $3.0 \le z \le 5.0$, respectively; and mixing the calcined product with a polar solvent, wherein the polar solvent is alcohol and/or ketone containing water in a range of 0.01% by mass or more and 12% by mass or less.

10. The method of producing a nitride fluorescent material according to claim 9, wherein the content of water in the polar solvent is in a range of 0.1% by mass or more and 10% by mass or less.

11. The method of producing a nitride fluorescent material according to claim 9, wherein in the formula (I), $M^a$ comprises at least one of Sr and Ca, $M^b$ comprises Li, $M^c$ is Eu, and $M^d$ is Al.

12. A nitride fluorescent material comprising a calcined product having a composition represented by following formula (I):

$$M^a{}_v M^b{}_w M^c{}_x M^d{}_y N_z \quad \text{(I)}$$

wherein $M^a$ is at least one element selected from the group consisting of Sr, Ca, Ba, and Mg; $M^b$ is at least one element selected from the group consisting of Li, Na, and K; $M^c$ is at least one element selected from the group consisting of Eu, Mn, Tb, and Ce; $M^d$ is at least one element selected from the group consisting of Al, B, Ga, and In; and v, w, x, y, and z are numbers satisfying $0.8 \le v \le 1.1$, $0.8 \le w \le 1.1$, $0.001 < x \le 0.1$, $2.0 \le y \le 4.0$, and $3.0 \le z \le 5.0$, respectively, and having a content of elemental oxygen in a range of 2% by mass or more and 4% by mass or less and a content of elemental fluorine is in a range of 0.1% by mass or more and 1% by mass or less.

13. The nitride fluorescent material according to claim 12, wherein an internal quantum efficiency is 80% or more.

14. The nitride fluorescent material according to claim 12, wherein in the formula (I), $M^a$ comprises at least one of Sr and Ca, $M^b$ comprises Li, $M^c$ is Eu, and $M^d$ is Al.

15. A light-emitting device comprising the nitride fluorescent material according to claim 12 and an excitation light source.

16. The light-emitting device according to claim 15, comprising a second fluorescent material having an peak fluorescence wavelength different from that of the nitride fluorescent material, wherein the second fluorescent material comprises at least one fluorescent material having a composition selected from the group consisting of compositions represented by following formulae:

$$Si_{6-p}Al_pO_pN_{8-p}:Eu \text{ (where } 0<p\le 4.2)$$

$$(Ca,Sr)_8MgSi_4O_{16}(Cl,F,Br)_2:Eu$$

$$(Ba,Sr,Ca)Ga_2S_4:Eu$$

$$(Ba,Sr)MgAl_{10}O_{17}:Mn$$

$$(Sr,Ca)AlSiN_3:Eu, \text{ and}$$

$$K_2(Si,Ge,Ti)F_6:Mn.$$

* * * * *